(12) United States Patent
Sato et al.

(10) Patent No.: US 8,950,082 B2
(45) Date of Patent: Feb. 10, 2015

(54) SUPERCRITICAL DRYING METHOD FOR SEMICONDUCTOR SUBSTRATE

(75) Inventors: Yohei Sato, Yokohama (JP); Hisashi Okuchi, Yokohama (JP); Hiroshi Tomita, Yokohama (JP); Hidekazu Hayashi, Yokohama (JP); Linan Ji, Shanghai (CN)

(73) Assignee: Kabushiki Kaisha Toshiba, Tokyo (JP)

( * ) Notice: Subject to any disclaimer, the term of this patent is extended or adjusted under 35 U.S.C. 154(b) by 337 days.

(21) Appl. No.: 13/600,860

(22) Filed: Aug. 31, 2012

(65) Prior Publication Data

US 2013/0055584 A1 Mar. 7, 2013

(30) Foreign Application Priority Data

Sep. 5, 2011 (JP) ................. 2011-192594

(51) Int. Cl.
*F26B 5/00* (2006.01)
*F26B 7/00* (2006.01)
*H01L 21/02* (2006.01)
*H01L 21/67* (2006.01)
(Continued)

(52) U.S. Cl.
CPC ............ *F26B 7/00* (2013.01); *H01L 21/02057* (2013.01); *H01L 21/02101* (2013.01); *H01L 21/67034* (2013.01); *F26B 5/04* (2013.01); *F26B 3/00* (2013.01); *F26B 5/005* (2013.01)
USPC .................. 34/402; 34/405; 34/417; 34/497

(58) Field of Classification Search
USPC ............................ 34/402, 405, 413, 417, 497
See application file for complete search history.

(56) References Cited

U.S. PATENT DOCUMENTS 6,562,146 B1 * 5/2003 DeYoung et al. ............... 134/30
6,920,703 B2 * 7/2005 Taktsu et al. .................... 34/405
(Continued)

FOREIGN PATENT DOCUMENTS

JP 2002-336675 11/2002
JP 2003-92240 3/2003
(Continued)

OTHER PUBLICATIONS

L. Ji et al., "Supercritical Drying Method for Semiconductor Substrate and Supercritical Drying Apparatus," U.S. Appl. No. 13/420,870, filed Mar. 15, 2012.
(Continued)

*Primary Examiner* — Jiping Lu
(74) *Attorney, Agent, or Firm* — Finnegan, Henderson, Farabow, Garrett & Dunner, L.L.P.

(57) ABSTRACT

According to one embodiment, a supercritical drying method for a semiconductor substrate comprises introducing a semiconductor substrate, a surface of the semiconductor substrate being wet with a water-soluble organic solvent, to the inside of a chamber, hermetically sealing the chamber and increasing a temperature inside the chamber to not lower than a critical temperature of the water-soluble organic solvent, thereby bringing the water-soluble organic solvent into a supercritical state, decreasing a pressure inside the chamber and changing the water-soluble organic solvent in the supercritical state to a gas, thereby discharging the water-soluble organic solvent from the chamber, starting a supply of an inert gas into the chamber as the pressure inside the chamber decreases to atmospheric pressure, and cooling the semiconductor substrate in a state where the inert gas exists inside the chamber.

13 Claims, 3 Drawing Sheets

(51) Int. Cl.
*F26B 5/04* (2006.01)
*F26B 3/00* (2006.01)

(56) References Cited

U.S. PATENT DOCUMENTS

| | | |
|---|---|---|
| 2011/0314689 A1 | 12/2011 | Okuchi et al. |
| 2012/0031434 A1 | 2/2012 | Matsui et al. |
| 2012/0186097 A1 | 7/2012 | Hayashi et al. |

FOREIGN PATENT DOCUMENTS

| | | |
|---|---|---|
| JP | 2004-327894 | 11/2004 |
| JP | 2006-130418 | 5/2006 |
| JP | 2010-212585 | 9/2010 |

OTHER PUBLICATIONS

Y. Sato et al., "Supercritical Drying Method and Apparatus for Semiconductor Substrates," U.S. Appl. No. 13/369,970, filed Feb. 9, 2012.

\* cited by examiner

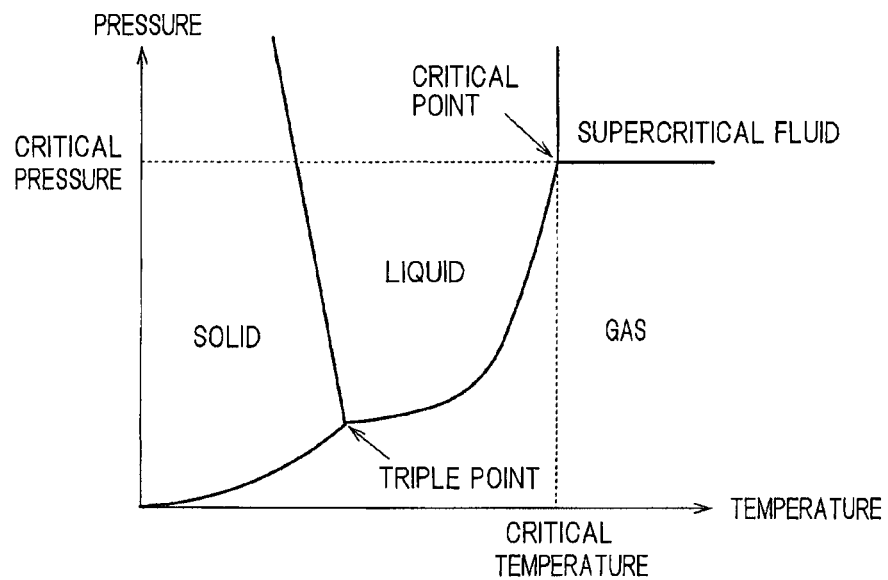
F I G. 1
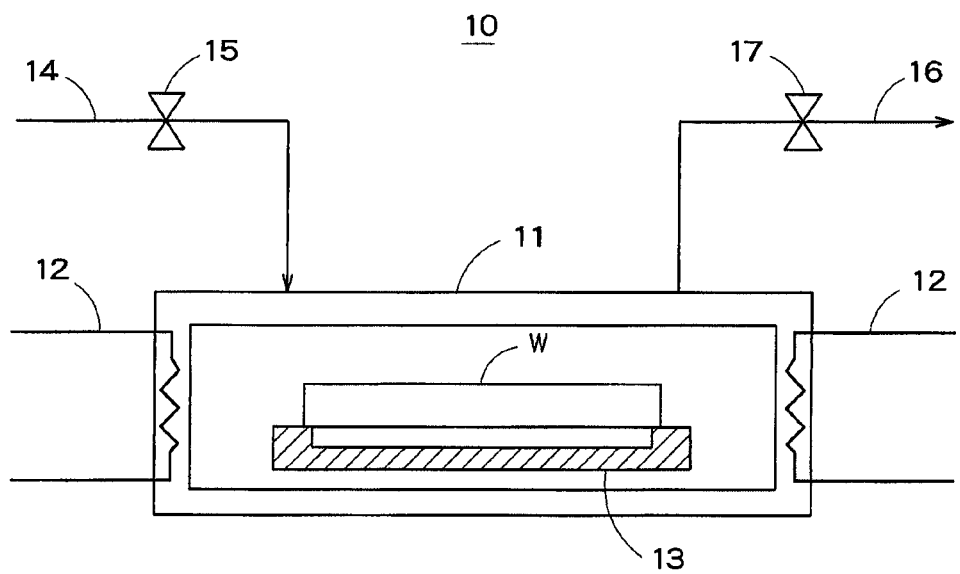
F I G. 2

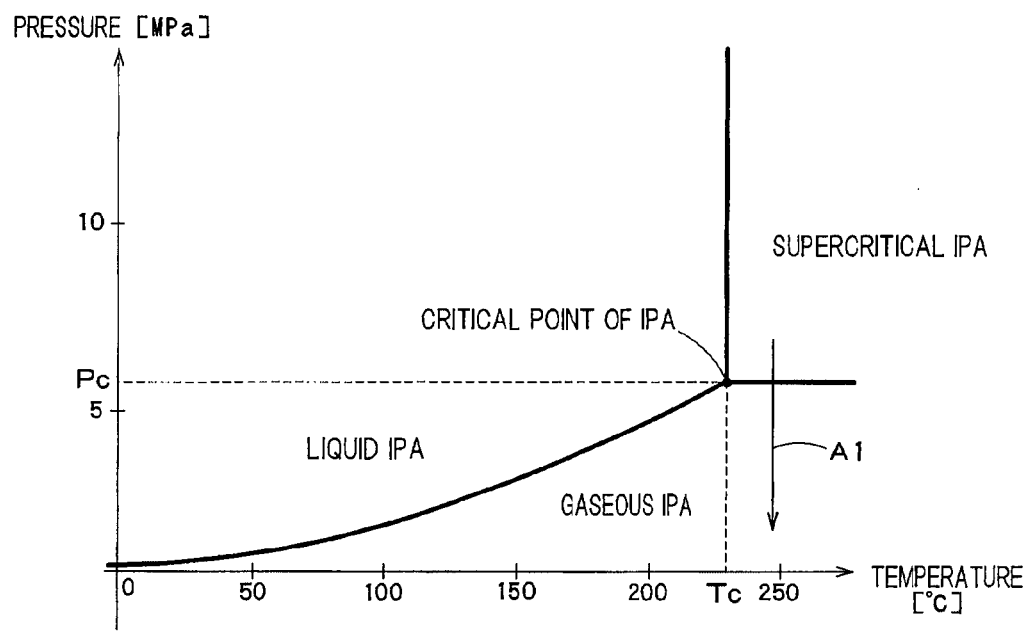
F I G. 4
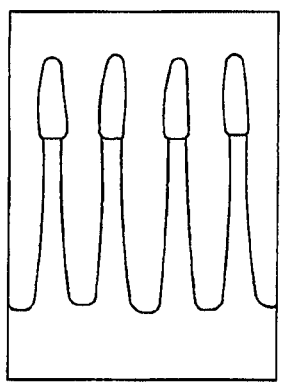 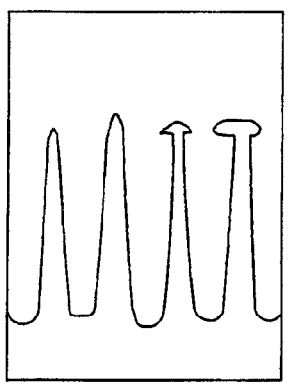 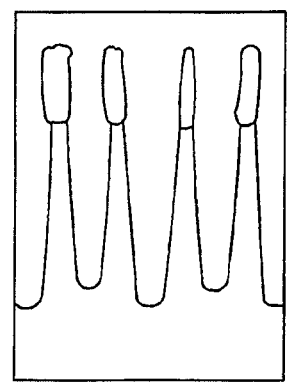
F I G. 5A    F I G. 5B    F I G. 5C ized curve representing a boundary between the liquid phase and the solid phase.

SUPERCRITICAL DRYING METHOD FOR SEMICONDUCTOR SUBSTRATE

CROSS REFERENCE TO RELATED APPLICATION

This application is based upon and claims benefit of priority from the Japanese Patent Application No. 2011-192594, filed on Sep. 5, 2011, the entire contents of which are incorporated herein by reference.

FIELD

Embodiments described herein relate generally to a supercritical drying method for a semiconductor substrate.

BACKGROUND

A manufacturing process for a semiconductor device includes a variety of steps such as a lithography step, a dry-etching step, and an ion-planting step. After completion of each step and before moving to the next step, a cleaning step for removing impurities and a residue left on a wafer surface to clean the wafer surface, a rinsing step for removing a chemical residue after the cleaning, and a drying step are implemented.

For example, in a wafer cleaning treatment after the etching step, a chemical solution is supplied to the wafer surface for the cleaning treatment, and pure water is thereafter supplied to perform a rinsing treatment. After the rinsing treatment, there is performed a drying treatment for removing the pure water remaining on the wafer surface and drying the wafer.

As a method for performing the drying treatment, there are for example known rotary drying in which the pure water on the wafer is discharged through use of centrifugal force generated by rotation, IPA (isopropyl alcohol) drying in which the pure water on the wafer is replaced with IPA and the IPA is vaporized to dry the wafer, and some other drying. However, there has been a problem with these general drying treatments in that fine patterns formed on the wafer come into contact with one another when drying due to surface tension of the liquid remaining on the wafer, resulting in a blockage.

In order to solve such a problem, there has been proposed supercritical drying in which surface tension is zero. In the supercritical drying, after the wafer cleaning treatment, the liquid on the wafer is replaced with another solvent such as IPA, which is finally replaced with a supercritical drying solvent, and the wafer is introduced into a supercritical chamber while the surface thereof is held wet with the IPA. Subsequently, carbon dioxide brought into a supercritical state (supercritical $CO_2$ fluid) is supplied to the chamber. The IPA on the wafer is gradually dissolved into the supercritical $CO_2$ fluid, and discharged from the chamber along with the supercritical $CO_2$ fluid. Thereby, the IPA on the wafer is replaced with the supercritical $CO_2$ fluid. Subsequently, a pressure inside the chamber is decreased and the supercritical $CO_2$ fluid is subjected to a phase change to gaseous $CO_2$, to complete drying of the wafer.

However, with a critical pressure of carbon dioxide being about 7.5 MPa, there has been a problem in that a thick metal-made chamber having performance resistant to a pressure not smaller than the above the critical pressure is required as a treatment facility, and therefore, the cost of the chamber as a single body is increased. Thus, cost of the device as a total is increased.

There is also known a method for performing drying not by using the supercritical $CO_2$ fluid as the drying solvent, but by bringing the IPA, which is a replacement solution for rinsing pure water after chemical-solution cleaning, itself into a supercritical state and evaporating and discharging the IPA. With the supercritical pressure of the IPA being about 5.4 MPa, a thickness required for the chamber is smaller than that in the case of using the supercritical $CO_2$ fluid, thereby allowing reduction in cost of the device. Further, since the IPA, which serves as the solution to be replaced with pure water, is directly brought into the supercritical state, a step of replacing the IPA with the supercritical $CO_2$ fluid as performed in a carbon supercritical is unnecessary. Moreover, a $CO_2$ supply system, a boosting device, and the like are unnecessary, thus allowing cost reduction.

However, there has been a problem with the drying method of bringing an organic solvent, such as IPA, into the supercritical state as thus described in that a metal material film and a polysilicon film formed on a semiconductor substrate are etched, thereby causing deterioration in electric characteristics of a semiconductor device.

BRIEF DESCRIPTION OF THE DRAWINGS

FIG. 1 is a state diagram showing a relation among a pressure, a temperature, and a phase state of matter;

FIG. 2 is a schematic constitutional view of a supercritical drying device according to an embodiment of the present invention;

FIG. 4 is a graph showing a vapor pressure curve of IPA; and

FIGS. 5A to 5C are diagrams each showing a pattern on a semiconductor substrate before and after a supercritical drying treatment.

DETAILED DESCRIPTION

Figure 3:
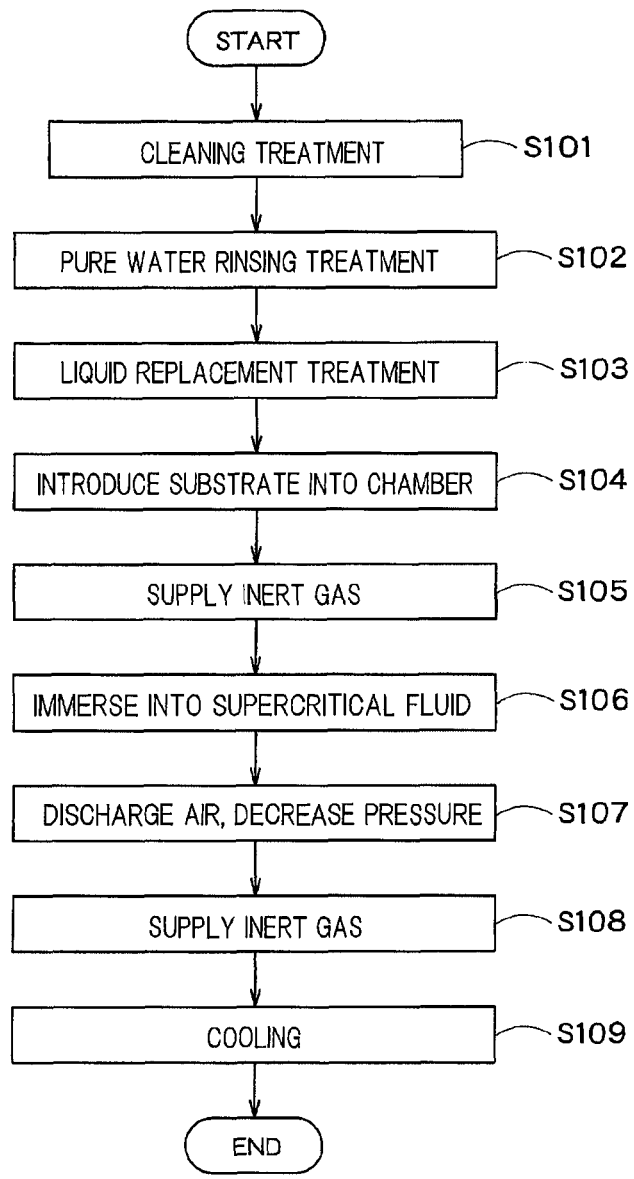
FIG. 3 is a flowchart explaining a supercritical drying method according to the embodiment.

According to one embodiment, a supercritical drying method for a semiconductor substrate comprises introducing a semiconductor substrate, a surface of the semiconductor substrate being wet with a water-soluble organic solvent, to the inside of a chamber, hermetically sealing the chamber and increasing a temperature inside the chamber to not lower than a critical temperature of the water-soluble organic solvent, thereby bringing the water-soluble organic solvent into a supercritical state, decreasing a pressure inside the chamber and changing the water-soluble organic solvent in the supercritical state to a gas, thereby discharging the water-soluble organic solvent from the chamber, starting a supply of an inert gas into the chamber as the pressure inside the chamber decreases to atmospheric pressure, and cooling the semiconductor substrate in a state where the inert gas exists inside the chamber.

Embodiments will now be explained with reference to the accompanying drawings.

First, supercritical drying will be described. FIG. 1 is a state diagram showing a relation among a pressure, a temperature and a phase state of matter. Functional matter of a supercritical fluid used for supercritical drying have three states of being called three phases of matter, which are a gaseous phase (gas), a liquid phase (liquid) and a solid phase (solid).

As shown in FIG. 1, the above three phases are separated with a vapor pressure curve (gas-phase equilibrium line) representing a boundary between the gaseous phase and the liquid phase, a sublimation curve representing a boundary between the gaseous phase and the solid phase, and a dissolution curve representing a boundary between the solid phase and the liquid phase. A point at which these three phases overlap is a triple point. When the vapor pressure curve extends from this triple point to a high-temperature/high-pressure side, it reaches a critical point as a limit for the gaseous phase and the liquid phase being coexistent. At this critical point, densities of the gaseous phase and the liquid phase become equal, and the interface in a gas/liquid coexistent state disappears.

In the state where the temperature and pressure are higher than the critical point, there is no distinction between the gaseous phase and the liquid phase, and the matter becomes a supercritical fluid. A supercritical fluid is a fluid compressed to have a high density at a temperature not lower than a supercritical temperature. The supercritical fluid is similar to a gas in that spreading force of solvent molecules is dominant. Meanwhile, the supercritical fluid is similar to a liquid in that an influence of cohesive force of molecules is not ignorable, thus having a property to dissolve a variety of matter.

Further, the supercritical fluid has a very high infiltrative property as compared with the liquid, and has a characteristic of readily infiltrating even into a fine structure.

Moreover, the supercritical fluid is dried so as to convert the phase directly from the supercritical state to the gaseous phase, thereby making the interface between the gas and the liquid nonexistent, namely preventing capillary force (surface tension) from acting. Consequently, drying without destroying the fine structure is allowed. The supercritical drying is drying a substrate through use of the supercritical state of such a supercritical fluid.

Next, a supercritical drying device for supercritically drying a semiconductor substrate will be described using FIG. 2. As shown in FIG. 2, a supercritical drying device 10 is provided with a chamber 11 with a heater 12 built therein. The chamber 11 is a high-pressure container formed of a SUS or the like. The heater 12 can adjust a temperature inside the chamber 11. The on/off of the heater 12 are controlled by a control unit, which is not shown. Although the configuration is shown in FIG. 2 where the heater 12 is built in the chamber 11, there may be formed a configuration where the heater 12 is provided on an outer periphery of the chamber 11.

Further, the chamber 11 is provided with a stage 13 as a ring-like flat plate for holding a semiconductor substrate W to be subject to the supercritical drying treatment.

The chamber 11 is linked with a pipe 14 such that an inert gas can be supplied to the inside of the chamber 11. As the inert gas, nitrogen, carbonic acid or a noble gas such as an argon can be used.

Further, a pipe 16 is connected with the chamber 11, and the gas and the supercritical fluid inside the chamber 11 can be discharged to the outside via this pipe 16.

The pipe 14 and the pipe 16 are formed, for example, of the same material (SUS) as the chamber 11. The pipe 14 and the pipe 16 are respectively provided with a valve 15 and a valve 17, and closing the valve 15 and the valve 17 can bring the inside of the chamber 11 into a hermetically sealed state.

Next, cleaning and drying methods for the semiconductor substrate according to the present embodiment will be described using a flowchart shown in FIG. 3.

(Step S101) A semiconductor substrate to be treated is introduced into a cleaning chamber, which is not shown. A chemical solution is supplied to the surface of the semiconductor substrate to perform a cleaning treatment. As the chemical solution, for example, sulfuric acid, hydrofluoric acid, hydrochloric acid, hydrogen peroxide, or the like can be used.

Herein, the cleaning treatment includes such a treatment as isolating a resist from the semiconductor substrate, removing particles and metal impurities, removing by etching a film formed on the substrate, and the like. A pattern having fine concavities and convexities is formed on the semiconductor substrate. The fine pattern may be formed before the cleaning treatment, or may be formed by this cleaning treatment.

(Step S102) After the cleaning treatment of Step S101, pure water is supplied to the surface of the semiconductor substrate, to perform a pure-water rinsing treatment to rinse the chemical solution remained on the surface of the semiconductor substrate.

(Step S103) After the pure-water rinsing treatment of Step S102, a liquid replacement treatment is performed where the semiconductor substrate whose surface is wet with the pure water is immersed into a water-soluble organic solvent and the liquid on the surface of the semiconductor substrate, i.e. pure water, is replaced with the water-soluble organic solvent.

The water-soluble organic solvent used in this step is, for example, alcohol such as isopropyl alcohol (IPA), ketone or the like, and one having a higher vapor pressure (a lower boiling point) than the pure water. Herein, the case of using the IPA as the water-soluble organic solvent will be described.

(Step S104) After the liquid replacement treatment of Step S103, the semiconductor substrate is taken out from the cleaning chamber while the surface thereof is held wet with the IPA such that the surface does not naturally get dry. Then, the semiconductor substrate is introduced into the chamber 11 shown in FIG. 2 and fixed to the stage 13.

(Step S105) An inert gas is supplied to the inside of the chamber 11 via the pipe 14. Thereby, an atmosphere (air) inside the chamber 11 is purged via the pipe 16. The inert gas is supplied at a predetermined time period based on a volume of the chamber 11.

(Step S106) While the supply of the inert gas is stopped, the valves 15 and 17 are closed to bring the inside of the chamber 11 into a hermetically sealed state. Using the heater 12, the IPA covering the surface of the semiconductor substrate is heated inside the chamber 11 in the hermetically sealed state. As the heated and evaporated IPA increases, the pressure inside the chamber 11 hermetically sealed and having a given volume increases in accordance with a vapor pressure curve indicated of the IPA indicated in FIG. 4.

Herein, although an actual pressure inside the chamber 11 is a total sum of partial pressures of all gaseous molecules existing inside the chamber 11, a partial pressure of the gaseous IPA will be described as the pressure inside the chamber 11 in the present embodiment.

As shown in FIG. 4, when the temperature inside the chamber 11 increases to a predetermined temperature not lower than a critical temperature Tc ($\approx 235.6°$ C.) of the IPA in a state where the pressure inside the chamber 11 has reached a critical pressure Pc ($\approx 5.4$ MPa) of the IPA, the IPA (gaseous IPA and liquid IPA) inside the chamber 11 comes into the supercritical state. Thereby, the inside of the chamber 11 is filled with supercritical IPA (IPA in the supercritical state), and the surface of the semiconductor substrate comes into the state of being covered with the supercritical IPA.

It is necessary to prevent all the liquid IPA covering the surface of the substrate from being vaporized until the IPA comes into the supercritical state. In other words, it is necessary that the surface of the semiconductor substrate to be wet with the liquid IPA and that the gaseous IPA and the liquid IPA to be coexistent inside the chamber 11 until the IPA comes into the supercritical state.

Substituting the temperature Tc, the pressure Pc and the volume of the chamber 11 into an equation of state of a gas (where PV=nRT; P is a pressure, V is a volume, n is the number of moles, R is a gas constant, and T is a temperature) can give an amount nc (mol) of the IPA existing in a gaseous state inside the chamber 11 when the IPA comes into the supercritical state.

The liquid IPA not less than nc (mol) needs to exist inside the chamber 11 before heating is started in Step S106. When the amount of IPA on the semiconductor substrate which is introduced into the chamber 11 is less than nc (mol), the liquid IPA is supplied from a chemical solution supplying unit, which is not shown, to the inside of the chamber 11 so as to make the IPA not less than nc (mol) exist inside the chamber 11.

(Step S107) After the heating in Step S106, the valve 17 is opened to discharge the supercritical IPA inside the chamber 11 and decrease the pressure inside the chamber 11 (see an arrow A1 of FIG. 4). At this time, the temperature inside the chamber 11 is kept not lower than the temperature Tc. When the pressure inside the chamber 11 becomes not higher than the critical pressure Pc of the IPA, the IPA is subjected to a phase change from the supercritical fluid to the gas.

(Step S108) After the pressure inside the chamber 11 is decreased to the atmospheric pressure, the valve 15 is opened and the inert gas is supplied to the inside of the chamber 11. The inert gas is discharged from the chamber 11 via the pipe 16. This can prevent the atmosphere (air) from flowing into the chamber 11. Further, it is possible to discharge the gaseous IPA inside the chamber 11 along with the inert gas. It is to be noted that the inert gas may be supplied to the inside of the chamber 11 before the voltage inside the chamber 11 decreases to the atmospheric pressure.

(Step S109) After a lapse of a predetermined time period from the start of supplying the inert gas in Step S108, the heater 12 is turned off, and the chamber 11 and the semiconductor substrate are cooled. The time from the start of supplying the inert gas to the start of cooling (turning-off of the heater 12) is, for example, the time required for sufficiently discharging the gaseous IPA from the chamber 11, and is decided based on the volume of the chamber 11, and the like.

After the cooling of the chamber 11 and the semiconductor substrate, the semiconductor substrate is taken out of the chamber 11.

As thus described, in the present embodiment, the chamber 11 and the semiconductor substrate are cooled while the inert gas is supplied.

FIGS. 5A to 5C show patterns on the semiconductor substrate after the supercritical drying treatment, respectively regarding the case of performing the cooling while supplying the inert gas and the case of performing the cooling without supplying the inert gas.

FIG. 5A shows a pattern before the supercritical drying treatment. A convex pattern has laminates of a polysilicon film and a metal film.

FIG. 5B shows a pattern on the semiconductor substrate in the case of performing the cooling without supplying the inert gas, namely after the supercritical drying treatment from which Step S108 of the flowchart in FIG. 4 is not included. As seen from FIG. 5B, the polysilicon film and the metal film are etched, and a figuration of the convex pattern has thus been damaged. This is because, when the pressure inside the chamber 11 decreases to the atmospheric pressure, the atmosphere (air) flows into the chamber 11, and the convex pattern is exposed to oxygen in the air and oxidized inside the chamber 11 at a high temperature.

FIG. 5C shows a pattern on the semiconductor substrate after the supercritical drying treatment in the case of performing the cooling while supplying the inert gas. It is found from FIG. 5C that damage to the convex pattern has been suppressed. This is because supplying the inert gas causes the air to flow into the chamber 11, thereby preventing the convex pattern from being exposed to oxygen.

According to the present embodiment, the liquid IPA covering the surface of the semiconductor substrate is replaced with the supercritical IPA, and thereafter, the supercritical IPA inside the chamber 11 is made dry such that he supercritical IPA inside the chamber 11 is subjected to a direct phase change to the gaseous IPA. For this reason, capillary force (surface tension) does not act on the fine pattern on the semiconductor substrate, thereby allowing the semiconductor substrate to get dry without destroying the fine pattern.

Further, as the pressure inside the chamber 11 decreases to the atmospheric pressure, the supply of the inert gas is started, so that the air is prevented from flowing into the chamber 11. Hence, it is possible prevent the pattern on the semiconductor substrate from being exposed to oxygen in a high temperature state before cooling, so as to suppress damage to the pattern, thereby preventing deterioration in electric characteristics of the semiconductor device.

The pattern formed on the semiconductor substrate, for example, includes a titanium nitride film, a tungsten film, a molybdenum film, a tungsten nitride film, a molybdenum nitride film, and the like, as a metal film. The metal film is, for example, provided in a convex part of the pattern formed on the semiconductor substrate.

Although the inert gas is kept being supplied when cooling of the chamber 11 and the semiconductor substrate in the above embodiment, the valves 15 and 17 may be closed to bring the chamber 11 into a hermetically sealed state while the inert gas exists inside the chamber 11 when cooling in Step S109. It is also possible, by such a method, to prevent the air from flowing into the chamber 11 before cooling. Hence, it is possible to prevent the pattern on the semiconductor substrate from being exposed to oxygen in the air, and thereby to suppress damage to the pattern.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A supercritical drying method for a semiconductor substrate, comprising:
    introducing a semiconductor substrate, a surface of the semiconductor substrate being wet with a water-soluble organic solvent, to the inside of a chamber;
    hermetically sealing the chamber and increasing a temperature inside the chamber to not lower than a critical temperature of the water-soluble organic solvent, thereby bringing the water-soluble organic solvent into a supercritical state;
    decreasing a pressure inside the chamber and changing the water-soluble organic solvent in the supercritical state to a gas, thereby discharging the water-soluble organic solvent from the chamber;
    starting a supply of an inert gas into the chamber as the pressure inside the chamber decreases to atmospheric pressure, and cooling the semiconductor substrate in a state where the inert gas exists inside the chamber.

2. The supercritical drying method for a semiconductor substrate according to claim 1, wherein the inert gas is kept being discharged from the chamber while the inert gas is kept being supplied into the chamber when cooling the semiconductor substrate.

3. The supercritical drying method for a semiconductor substrate according to claim 1, wherein the chamber is hermetically sealed when cooling the semiconductor substrate.

4. The supercritical drying method for a semiconductor substrate according to claim 1, wherein the temperature inside the chamber is kept not lower than the critical temperature of the water-soluble organic solvent during the decrease in pressure inside the chamber.

5. The supercritical drying method for a semiconductor substrate according to claim 1, wherein the water-soluble organic solvent in an amount corresponding to a volume of the chamber and the critical temperature and critical pressure of the water-soluble organic solvent is supplied into the chamber before the temperature inside the chamber is increased.

6. The supercritical drying method for a semiconductor substrate according to claim 1, wherein a film containing tungsten, molybdenum, tungsten nitride, molybdenum nitride, titanium nitride or polysilicon is formed on the semiconductor substrate.

7. The supercritical drying method for a semiconductor substrate according to claim 1, wherein a boiling point of the water-soluble organic solvent is lower than a boiling point of pure water.

8. The supercritical drying method for a semiconductor substrate according to claim 7, wherein the water-soluble organic solvent is alcohol or ketone.

9. The supercritical drying method for a semiconductor substrate according to claim 8, wherein the alcohol is isopropyl alcohol.

10. The supercritical drying method for a semiconductor substrate according to claim 1, wherein the inert gas is nitrogen, carbonic acid or a noble gas.

11. The supercritical drying method for a semiconductor substrate according to claim 1, wherein the inert gas is supplied into the chamber and an atmosphere is discharged from the chamber after introduction of the semiconductor substrate into the chamber and before hermetical sealing of the chamber.

12. The supercritical drying method for a semiconductor substrate according to claim 1, wherein a concavo-convex pattern is formed on the semiconductor substrate.

13. The supercritical drying method for a semiconductor substrate according to claim 12, wherein a film containing tungsten, molybdenum, tungsten nitride, molybdenum nitride, titanium nitride or polysilicon is formed in a convex part of the concavo-convex pattern.

* * * * *